(12) United States Patent
Yoshiike

(10) Patent No.: US 10,272,682 B2
(45) Date of Patent: Apr. 30, 2019

(54) PIEZOELECTRIC DEVICE, LIQUID EJECTING HEAD, MANUFACTURING METHOD OF PIEZOELECTRIC DEVICE, AND MANUFACTURING METHOD OF LIQUID EJECTING DEVICE

(71) Applicant: Seiko Epson Corporation, Tokyo (JP)

(72) Inventor: Masashi Yoshiike, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/533,332

(22) PCT Filed: Nov. 17, 2015

(86) PCT No.: PCT/JP2015/005724
§ 371 (c)(1),
(2) Date: Jun. 5, 2017

(87) PCT Pub. No.: WO2016/092747
PCT Pub. Date: Jun. 16, 2016

(65) Prior Publication Data
US 2017/0341394 A1     Nov. 30, 2017

(30) Foreign Application Priority Data

Dec. 9, 2014   (JP) ................................ 2014-248660

(51) Int. Cl.
*B41J 2/16* (2006.01)
*B41J 2/14* (2006.01)
(Continued)

(52) U.S. Cl.
CPC ........... *B41J 2/14233* (2013.01); *B41J 2/161* (2013.01); *B41J 2/1607* (2013.01); *B41J 2/1623* (2013.01);
(Continued)

(58) Field of Classification Search
CPC .... B41J 2/14233; B41J 2/1607; B41J 2/1623; H01L 41/312; H01L 41/047
See application file for complete search history.

(56) References Cited

U.S. PATENT DOCUMENTS

2009/0309938 A1   12/2009   Yoneda
2010/0029031 A1*  2/2010    Perruchot ........... B81C 1/00507
                                                          438/50
(Continued)

FOREIGN PATENT DOCUMENTS

EP    1403050 A1    3/2004
EP    2366548 A1    9/2011
(Continued)

*Primary Examiner* — Sharon A. Polk
(74) *Attorney, Agent, or Firm* — Workman Nydegger

(57) ABSTRACT

A piezoelectric device includes a first substrate that includes a piezoelectric element (32) provided in a first region where bending deformation is allowed and an electrode layer (39) electrically connected to the piezoelectric element (32), a second substrate in which a bump electrode (43) abutting and conducting the electrode layer (39), and having elasticity is formed, and which is disposed so as to face the piezoelectric element (32) with a predetermined space, and adhesive (43) that bonds the first substrate and the second substrate in a state where a distance between the first substrate and the second substrate is maintained. The adhesive (43) has a width in a center portion in a height direction relative to a surface of the first substrate or the second substrate greater than a width in end portions in the same direction.

4 Claims, 5 Drawing Sheets

(51) Int. Cl.
  *H01L 41/047*   (2006.01)
  *H01L 41/312*   (2013.01)

(52) U.S. Cl.
  CPC ........... *B41J 2/1626* (2013.01); *B41J 2/1642* (2013.01); *B41J 2/1643* (2013.01); *B41J 2/1645* (2013.01); *B41J 2/1646* (2013.01); *H01L 41/047* (2013.01); *H01L 41/312* (2013.01); *B41J 2002/14491* (2013.01)

(56) References Cited

U.S. PATENT DOCUMENTS

| | | |
|---|---|---|
| 2011/0226807 A1 | 9/2011 | Essen |
| 2014/0092173 A1 | 4/2014 | Kitamura |

FOREIGN PATENT DOCUMENTS

| | | |
|---|---|---|
| JP | 2008183880 A | 8/2008 |
| JP | 2010069750 A | 4/2010 |
| JP | 2011194889 A | 10/2011 |
| JP | 2012011628 A | 1/2012 |
| JP | 2014-024325 A | 2/2014 |
| WO | 201216541 A | 12/2012 |

\* cited by examiner

[Fig. 1]
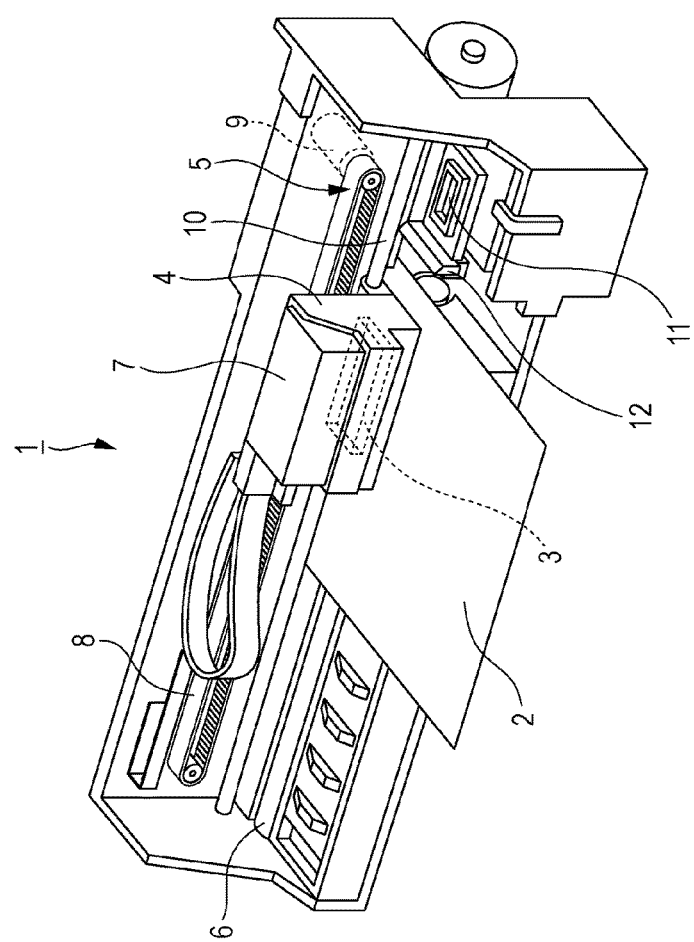

[Fig. 2]
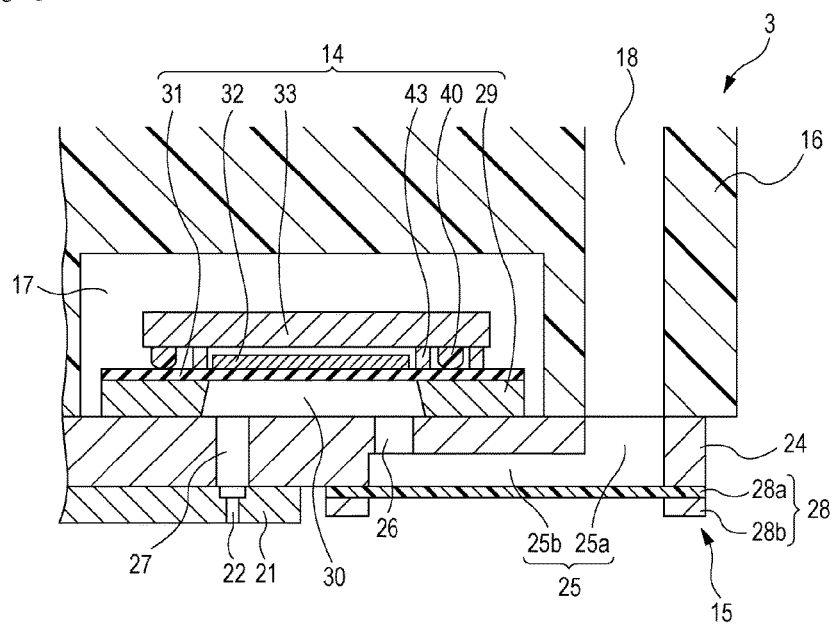
[Fig. 3]
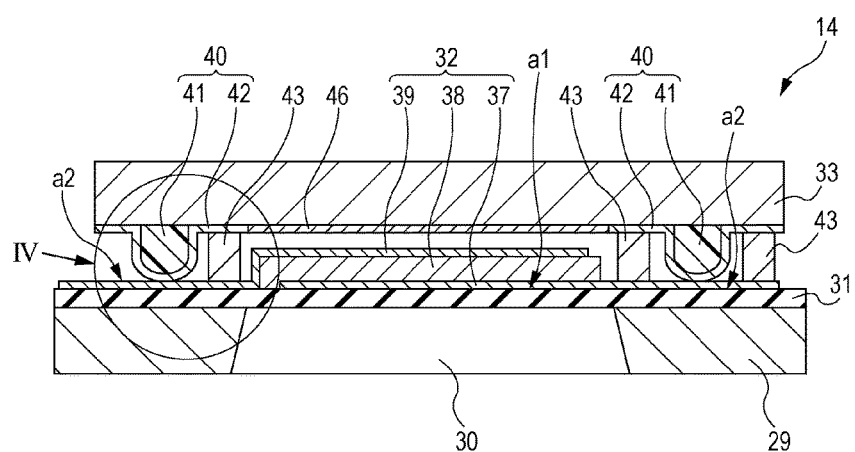

[Fig. 4]
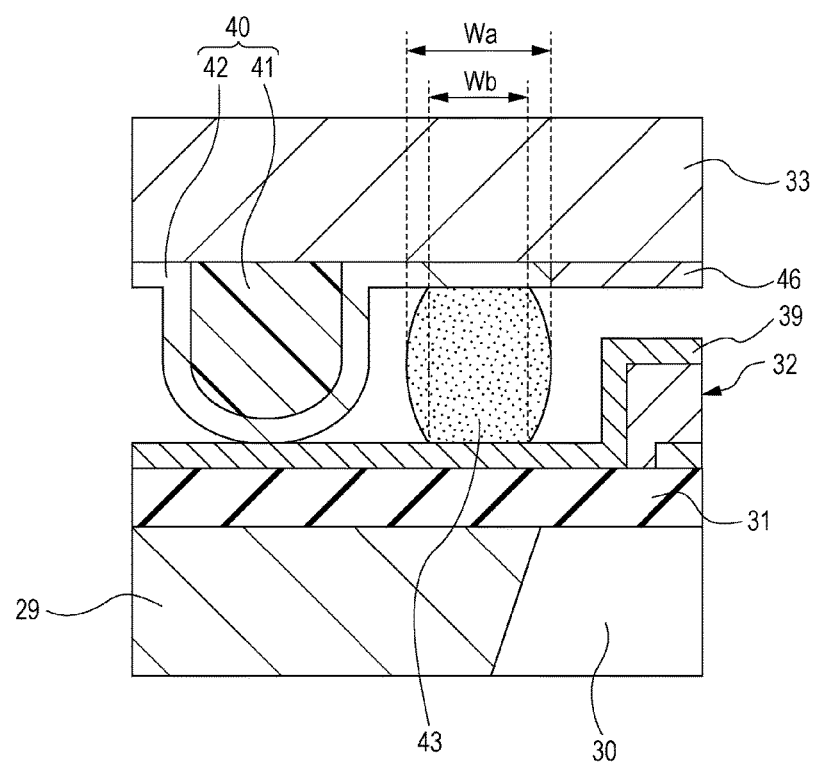

[Fig. 5A]
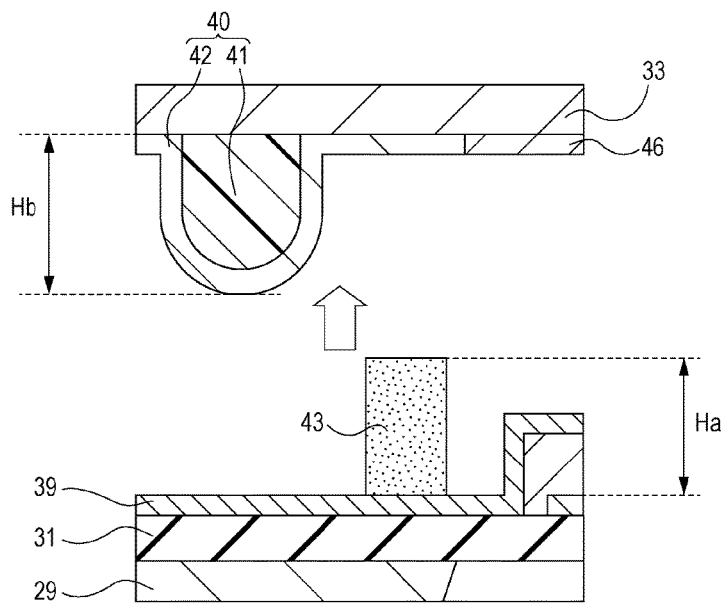
[Fig. 5B]
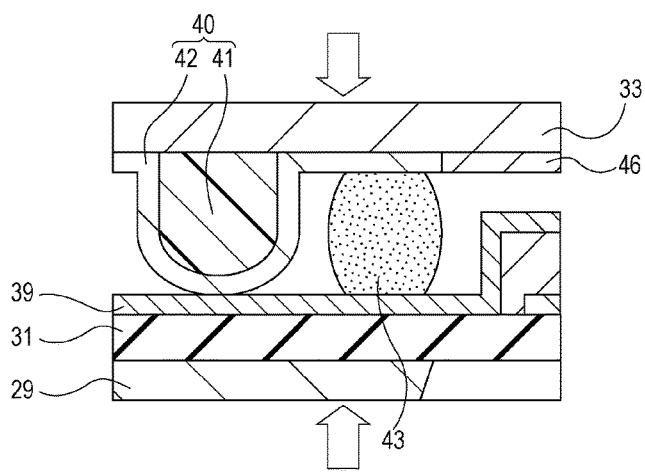

[Fig. 6]
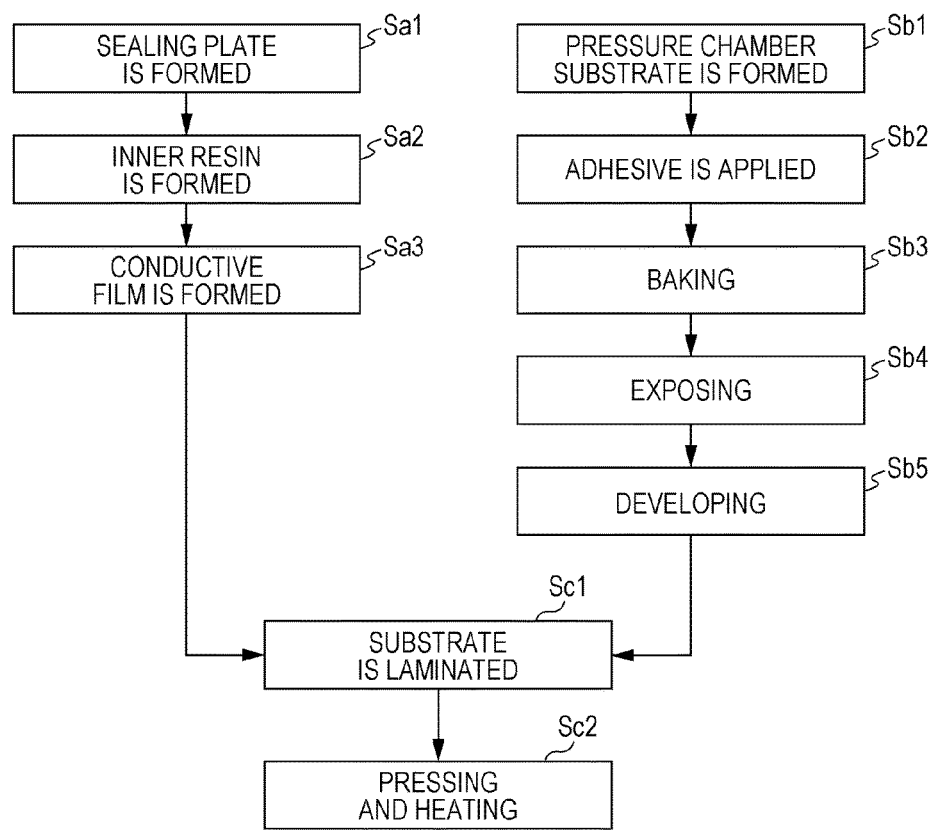

PIEZOELECTRIC DEVICE, LIQUID EJECTING HEAD, MANUFACTURING METHOD OF PIEZOELECTRIC DEVICE, AND MANUFACTURING METHOD OF LIQUID EJECTING DEVICE

TECHNICAL FIELD

The present invention relates to a piezoelectric device including a piezoelectric element that is deformed by applying a voltage, a liquid ejecting head, a manufacturing method of a piezoelectric device, and a manufacturing method of a liquid ejecting head.

BACKGROUND ART

A piezoelectric device is a device including a piezoelectric element and is applied to various apparatus, a sensor, and the like. For example, in a liquid ejecting apparatus, various liquids are ejected from a liquid ejecting head by using the piezoelectric device. As the liquid ejecting apparatus, for example, there is an image recording apparatus such as an ink jet type printer or an ink jet type plotter and, in recent years, the liquid ejecting apparatus has been also applied to various manufacturing apparatuses by taking advantage of the fact that a very small amount of a liquid can be accurately landed in a predetermined position. For example, the liquid ejecting apparatus is applied to a display manufacturing apparatus for manufacturing a color filter such as a liquid crystal display, an electrode forming apparatus for forming an electrode of an organic electro luminescence (EL) display, a field emission display (FED), and the like, and a chip manufacturing apparatus for manufacturing a bio-chip (biochemical element). Then, a recording head for the image recording apparatus ejects a liquid ink and a color material ejecting head for the display manufacturing apparatus ejects a solution of each color material of Red (R), Green (G), and Blue (B). Furthermore, in an electrode material ejecting head for the electrode forming apparatus, a liquid electrode material is ejected and in a bio-organic material ejecting head for the chip manufacturing apparatus, a solution of a bio-organic material is ejected.

The liquid ejecting head described above is configured by laminating a nozzle plate on which a plurality of nozzles are formed, a pressure chamber forming substrate in which a pressure chamber corresponding to each nozzle is formed, a piezoelectric element (a type of actuator) causing a pressure variation in a liquid within each pressure chamber, a sealing plate in which a concave section accommodating the piezoelectric element is formed, and the like. Then, the liquid ejecting head is configured to eject the liquid from the nozzle by using the pressure variation by causing the pressure variation (pressure change) in the liquid within the pressure chamber by supplying a driving signal to the piezoelectric element. Here, a technique for forming a driving circuit (also referred to as driver circuit) for transmitting a driving signal to each piezoelectric element on a surface facing the piezoelectric element within the concave section of the sealing plate has been developed (for example, see PTL 1). A bump electrode for electrically connecting the driving circuit and the piezoelectric element is formed on a surface on which the driving circuit is formed. Moreover, as the sealing plate, since the driving circuit can be created by a semiconductor process (that is, a film forming step, a photolithography step, an etching step, and the like), a substrate (hereinafter, referred to as a silicon substrate) made of silicon is used.

CITATION LIST

Patent Literature

PTL 1: JP-A-2009-252882

SUMMARY OF INVENTION

Technical Problem

Since the concave section is created in the sealing plate by an etching technique, an internal surface thereof is likely to be rough. If the driving circuit is formed on such a surface, there is a concern that a desired performance cannot be obtained. Thus, in a state where the driving circuit is formed on a surface of the planar silicon substrate on which the concave section is not formed and a space in which the piezoelectric element can be accommodated is formed, it is considered that the silicon substrate and a surface on which the piezoelectric element is laminated are bonded by adhesive. However, in such a configuration, since the adhesive is thickened, there is a concern that trouble occurs in a portion in which the adhesive protrudes because the adhesive before being cured is likely to protrude from a predetermined region. For example, there is a concern that an ejection failure occurs by inhibiting vibration of a vibration plate by causing the adhesive to protrude on a vibration region (variation region) of the vibration plate. Thus, it is necessary to spread an adhesion region including a margin such as a protrusion region of the adhesive so as not to interfere between another portion configuring the piezoelectric device such as a displacement section of the vibration plate and the adhesive. Thus, it is difficult to reduce the size of the piezoelectric device and the liquid ejecting head.

The invention is made in view of the circumstances and an object of the invention is to provide a piezoelectric device that is able to be reduced in size while ensuring sufficient adhesive strength, a liquid ejecting head, a manufacturing method of a piezoelectric device, and a manufacturing method of a liquid ejecting head.

Solution to Problem

A piezoelectric device of the invention is proposed in order to achieve the above object and includes a first substrate that includes a piezoelectric element provided in a first region where bending deformation is allowed and an electrode layer electrically connected to the piezoelectric element; a second substrate in which a bump electrode abutting and conducting the electrode layer, and having elasticity is formed, and which is disposed so as to face the piezoelectric element with a predetermined space; and adhesive that bonds the first substrate and the second substrate in a state where a distance between the first substrate and the second substrate is maintained. The adhesive has a width in a center portion in a height direction with respect to a surface of the first substrate or the second substrate greater than a width in end portions in the same direction.

According to the configuration, since the width in the center portion of the adhesive in the height direction is greater than the width in the end portions of the adhesive in the height direction, it is possible to suppress that the adhesive spreads in an adhesion surface of the first substrate or the second substrate while ensuring a sufficient amount of the adhesive to ensure adhesive strength. Thus, it is possible to suppress that the adhesive protrudes from a predetermined region and to allow the adhesive to approach other portions configuring the piezoelectric device such as the first region as much as possible. As a result, it is possible to reduce the size of the piezoelectric device while ensuring sufficient adhesive strength.

Furthermore, a liquid ejecting head of the invention includes the piezoelectric device having the above configuration.

Furthermore, a manufacturing method of a piezoelectric device of the invention including a first substrate in which a piezoelectric element and an electrode layer electrically connected to the piezoelectric element is formed, a second substrate which is disposed so as to face the piezoelectric element with a predetermined space and in which a bump electrode abutting and conducting the electrode layer, and having elasticity is formed, and thermosetting adhesive that bonds the first substrate and the second substrate in a state where a distance between the first substrate and the second substrate is maintained, the manufacturing method including forming the bump electrode having a predetermined height in the second substrate; laminating the adhesive for forming the adhesive of which a height from a surface of the substrate is equal to or less than a height of the bump electrode on one of the first substrate and the second substrate; and bonding the substrate for bonding the first substrate and the second substrate in the height direction by curing the adhesive by heating in a state where the adhesive is contracted by pressing while interposing the adhesive between the first substrate and the second substrate.

According to the method, since both substrates are bonded by curing the adhesive by heating in a state where the adhesive is contracted in the height direction by pressing, it is possible to suppress that the adhesive spreads in an adhesion surface of the first substrate or the second substrate in a surface direction while ensuring a sufficient amount of the adhesive to ensure adhesive strength. Thus, it is possible to suppress that the adhesive protrudes from a predetermined region and to allow the adhesive to approach other portions configuring the piezoelectric device such as the first region as much as possible. As a result, it is possible to reduce the size of the piezoelectric device while ensuring sufficient adhesive strength.

Then, a manufacturing method of a liquid ejecting head of the invention includes manufacturing the piezoelectric device by the above manufacturing method.

BRIEF DESCRIPTION OF DRAWINGS

FIG. 1 is a perspective view describing a configuration of a printer.

FIG. 2 is a sectional view describing a configuration of a recording head.

FIG. 3 is a sectional view describing a configuration of an actuator unit.

FIG. 4 is an enlarged view of a region IV in FIG. 3.

FIG. 5A is a schematic view describing bonding of both substrates by adhesive.

FIG. 5B is a schematic view describing bonding of both substrates by adhesive.

FIG. 6 is a flowchart describing a flow of manufacturing steps of the actuator unit.

DESCRIPTION OF EMBODIMENTS

Hereinafter, embodiments of the invention will be described with reference to the accompanying drawings. Moreover, in the embodiments described below, although there are various limits as preferred specific examples of the invention, the scope of the invention is not limited to these embodiments unless a particular description to limit the invention is included in the following description. In addition, in the following description, in an ink jet type printer (hereinafter, referred to as a printer) that is a type of a liquid ejecting apparatus on which an ink jet type recording head (hereinafter, referred to as a recording head) that is a type of a liquid ejecting head is mounted, as a piezoelectric device according to the invention, a case where an actuator for ejecting ink is used is exemplified.

A configuration of a printer 1 will be described with reference to FIG. 1. The printer 1 is a device for performing recording of an image and the like by ejecting ink (a type of a liquid) onto a surface of a recording medium 2 (a type of a landing target) such as a recording paper. The printer 1 includes a recording head 3, a carriage 4 on which the recording head 3 is mounted, a carriage moving mechanism 5 that moves the carriage 4 in a main scanning direction, a transport mechanism 6 that feeds the recording medium 2 in a sub-scanning direction, and the like. Here, the ink is stored in an ink cartridge 7 as a liquid supply source. The ink cartridge 7 is detachably mounted on the recording head 3. Moreover, it is also possible to employ a configuration in which an ink cartridge is disposed on a body side of a printer and the ink is supplied from the ink cartridge to the recording head through an ink supply tube.

The carriage moving mechanism 5 includes a timing belt 8. Then, the timing belt 8 is driven by a pulse motor 9 such as a DC motor. Thus, if the pulse motor 9 is operated, the carriage 4 is guided by a guide rod 10 that is bridged to the printer 1 and reciprocates in the main scanning direction (width direction of the recording medium 2). A position of the carriage 4 in the main scanning direction is detected by a linear encoder (not illustrated) that is a type of a position information detection unit. The linear encoder transmits a detection signal thereof, that is, an encoder pulse (a type of position information) to a control section of the printer 1.

Furthermore, a home position that is a base point of scanning of the carriage 4 is set in an end portion region further on the outside than a recording region within a moving range of the carriage 4. In the home position, a cap 11 that seals a nozzle 22 formed on a nozzle surface (nozzle plate 21) of the recording head 3 and a wiping unit 12 for wiping the nozzle surface are disposed in this order from the end portion side.

Next, the recording head 3 will be described. FIG. 2 is a sectional view describing a configuration of the recording head 3. FIG. 3 is a sectional view enlarging a main portion of the recording head 3, that is, a sectional view of an actuator unit 14 (corresponding to a piezoelectric device of the invention). FIG. 4 is an enlarged view of a region IV in FIG. 3. In the embodiment, as illustrated in FIG. 2, the recording head 3 is mounted on a head case 16 in a state where the actuator unit 14 and a flow path unit 15 are laminated. Moreover, for the sake of convenience, a laminating direction of each member is described as a vertical direction.

The head case 16 is a box-shaped member made of synthetic resin and on an inside of which a reservoir 18 supplying the ink to each pressure chamber 30 formed. The reservoir 18 is a space for storing the ink, which is common in the pressure chambers 30 and is formed along a nozzle column direction. Moreover, an ink introduction path (not illustrated) introducing the ink on the ink cartridge 7 side to the reservoir 18 is formed above the head case 16. Furthermore, a rectangular parallelepiped-shaped accommodation space 17 that is recessed is formed on a lower surface side of the head case 16 from the lower surface to the middle of the head case 16 in a height direction. The flow path unit 15 described below is bonded to the lower surface of the head case 16 in a state of being positioned on the lower surface thereof, the actuator unit 14 (pressure chamber forming substrate 29, sealing plate 33, and the like) that is laminated on a communication substrate 24 is configured to be accommodated within the accommodation space 17.

The flow path unit 15 bonding to the lower surface of the head case 16 has the communication substrate 24, the nozzle plate 21, and a compliance sheet 28. The communication substrate 24 is a plate material made of silicon and, in the embodiment, is produced from a silicon single crystal substrate of which a surface (upper surface and lower surface) is a (110) plane. As illustrated in FIG. 2, a common liquid chamber 25 which communicates with the reservoir 18 and in which the ink common in each pressure chamber 30 is stored, and an individual communication path 26 that individually supplies the ink from the reservoir 18 to each pressure chamber 30 through the common liquid chamber 25 are formed in the communication substrate 24 by anisotropic etching. The common liquid chamber 25 is a space section that is elongated in the nozzle column direction (arrangement direction of the pressure chambers 30). The common liquid chamber 25 is configured of a first liquid chamber 25a passing through the communication substrate 24 in a plate thickness direction thereof and a second liquid chamber 25b that is recessed from the lower surface of the communication substrate 24 to a middle of the communication substrate 24 in the plate thickness direction toward the upper surface side and is formed in state where a thin plate section is left. A plurality of individual communication paths 26 are formed in the arrangement direction of the pressure chambers 30 corresponding to the pressure chambers 30 in the thin plate section of the second liquid chamber 25b. The individual communication path 26 communicates with one end section of the corresponding pressure chamber 30 in a longitudinal direction in a state where the communication substrate 24 and the pressure chamber forming substrate 29 are bonded in a state of being positioned.

Furthermore, a nozzle communication path 27 that passes through the communication substrate 24 in the plate thickness direction thereof is formed in a position of the communication substrate 24 corresponding to each nozzle 22. That is, a plurality of nozzle communication paths 27 are formed in the nozzle column direction corresponding to the nozzle column. The pressure chamber 30 and the nozzle 22 communicate by the nozzle communication path 27. The nozzle communication path 27 of the embodiment communicates with the other (side opposite to the individual communication path 26) end portion of the corresponding pressure chamber 30 in the longitudinal direction thereof in a state where the communication substrate 24 and the pressure chamber forming substrate 29 are bonded by being positioned.

The nozzle plate 21 is a substrate (for example, silicon single crystal substrate) made of silicon bonded to the lower surface (surface on a side opposite to the pressure chamber forming substrate 29) of the communication substrate 24. The nozzle plate 21 of the embodiment is bonded to a region outside of the compliance sheet 28 (common liquid chamber 25) in the communication substrate 24. A plurality of nozzles 22 are opened in the nozzle plate 21 in a linear shape (column shape). The plurality of arrayed nozzles 22 (nozzle column) are provided at equal distances in the sub-scanning direction orthogonal to the main scanning direction by a pitch (for example, 180 dpi) corresponding to a dot formation density from the nozzle 22 on one end side to the nozzle 22 on the other end side.

The compliance sheet 28 is bonded to a region outside of a region in which the nozzle plate 21 is bonded to the communication substrate 24 and a region corresponding to the common liquid chamber 25 in a state where an opening of a space formed of the common liquid chamber 25 on the lower surface side is closed. The compliance sheet 28 is configured of a flexible membrane 28a having flexibility and a hard fixing plate 28b on an upper surface of which the flexible membrane 28a is fixed. An opening is provided in a position of fixing plate 28b corresponding to the common liquid chamber 25 so as not to inhibit flexible deformation of the flexible membrane 28a. Thus, the lower surface of the common liquid chamber 25 is a compliance section that is divided only by the flexible membrane 28a. It is possible to absorb a pressure change generated in the ink within the reservoir 18 and the common liquid chamber 25 by a compliance section.

The actuator unit 14 is a thin plate-shaped device that functions as an actuator for generating pressure variation in the ink within each pressure chamber 30 and, as illustrated in FIG. 3, is unitized in which the pressure chamber forming substrate 29, a vibration plate 31, a piezoelectric element 32, and the sealing plate 33 are laminated. The actuator unit 14 is formed smaller than the accommodation space 17 so as to be accommodated within the accommodation space 17.

The pressure chamber forming substrate 29 (corresponding to a support plate in the invention) is a hard plate material made of silicon and, in the embodiment, is produced from the silicon single crystal substrate of which the surface (upper surface and lower surface) is the (110) plane. A space to be the pressure chamber 30 is formed in the pressure chamber forming substrate 29 by completely removing a part of the pressure chamber forming substrate 29 in the plate thickness direction by anisotropic etching. A plurality of the spaces, that are the pressure chambers 30 are arrayed corresponding to each nozzle 22. Each pressure chamber 30 is a space section that is elongated in a direction orthogonal to the nozzle column direction, the individual communication path 26 communicates with one end portion in the longitudinal direction, and the nozzle communication path 27 communicates with the other end portion.

The vibration plate 31 (corresponding to an elastic plate in the invention) is a thin film-like member having elasticity and is laminated on the upper surface (surface on a side opposite to the communication substrate 24 side) of the pressure chamber forming substrate 29. An upper opening of a space to be the pressure chamber 30 is sealed by the vibration plate 31. In other words, the pressure chamber 30 is divided by the vibration plate 31. A portion in the vibration plate 31 corresponding to the pressure chamber 30 (specifically, the upper opening of the pressure chamber 30) functions as a displacement portion that is displaced in a direction away from or a direction close to the nozzle 22 according to bending deformation of the piezoelectric element 32. That is, a region in the vibration plate 31 corresponding to the pressure chamber 30 is a first region a1 allowing the bending deformation and a region in the vibration plate 31 outside of the pressure chamber 30 is a second region a2 inhibiting the bending deformation. Moreover, for example, the vibration plate 31 is formed of an elastic film made of silicon dioxide ($SiO_2$) formed on the upper surface of the pressure chamber forming substrate 29 and an insulator film made of zirconium oxide ($ZrO_2$)

formed on the elastic film. Then, the piezoelectric element 32 is laminated in the region corresponding to each pressure chamber 30, that is, in the first region a1 on the insulation film (surface of the vibration plate 31 on a side opposite to the pressure chamber forming substrate 29). Moreover, the pressure chamber forming substrate 29 and the vibration plate 31 laminated thereon correspond to the first substrate in the invention.

The piezoelectric element 32 of the embodiment is a piezoelectric element of a so-called flexural mode. For example, the piezoelectric element 32 is configured by laminating a lower electrode layer 37 (individual electrode), a piezoelectric layer 38, and an upper electrode layer 39 (common electrode) in this order on the vibration plate 31. The piezoelectric element 32 having such a configuration is bending-deformed in the direction away from or the direction close to the nozzle 22 when applying an electric field according to a potential difference of both electrodes between the lower electrode layer 37 and the upper electrode layer 39. As illustrated in FIG. 3, a part of the upper electrode layer 39 and the lower electrode layer 37 are on the outside of the piezoelectric layer 38 from a region (that is, the first region a1) electrically connected to the piezoelectric element 32 and extend to a region (that is, the second region a2) further outside than a region corresponding to the pressure chamber 30. In the embodiment, the upper electrode layer 39 extends to the second region a2 on one side of the pressure chamber 30 in the longitudinal direction and the lower electrode layer 37 extends to the second region a2 on the other side. Then, corresponding bumps 40 (described below) respectively abut the extended portions. Moreover, the upper electrode layer 39 or the lower electrode layer 37 corresponds to the electrode layer in the invention.

The sealing plate 33 (corresponding to the second substrate in the invention) is a plate material made of silicon and, in the embodiment, is produced of the silicon single crystal substrate of which a surface (upper surface and lower surface) is a (110) plane. Furthermore, the sealing plate 33 of the embodiment does not form a recessed sealing space in which the piezoelectric element 32 is accommodated but is formed in a flat plate shape different from a sealing plate of the related art. The sealing plate 33 and the pressure chamber forming substrate 29 on which the vibration plate 31 is laminated are fixed by a thick adhesive 43. Thus, the sealing plate 33 is disposed on the vibration plate 31 with respect to the piezoelectric element 32 so as to cover a column of the piezoelectric elements 32 to form a distance to an extent not to inhibit the bending deformation of the piezoelectric element 32. That is, the pressure chamber forming substrate 29 on which the vibration plate 31 is laminated and the sealing plate 33 are bonded by the adhesive 43 in a state of maintaining a distance therebetween. Moreover, for example, a distance between the vibration plate 31 and the sealing plate 33 is set to be 5 μm to 25 μm.

Furthermore, a driving circuit 46 (driver circuit) for individually driving each piezoelectric element 32 is formed in a region of the sealing plate 33 facing the piezoelectric element 32. The driving circuit 46 is produced by using a semiconductor process (that is, a film forming step, a photolithography step, an etching step, and the like) on a surface of a silicon single crystal substrate (silicon wafer) which is the sealing plate 33. Furthermore, a bump 40 (corresponding to the bump electrode in the invention) having elasticity protruding on the pressure chamber forming substrate 29 side is formed in a region of end portions of the driving circuit 46. The bump 40 is configured of an inner resin 41 having elasticity and a conductive film 42 that is pulled from the driving circuit 46 in a shape of a wire and covers a surface of the inner resin 41. As the inner resin 41, for example, resin such as polyimide resin is used. Furthermore, as the conductive film 42, metal such as Au, Cu, and Ni is used.

The bumps 40 of the embodiment are respectively provided in a position corresponding to the upper electrode layer 39 extending to the second region a2 of one side of the pressure chamber 30 in the longitudinal direction and in a position corresponding to the lower electrode layer 37 extending to the second region a2 on the other side. Then, the bumps 40 respectively abut and conduct to corresponding upper electrode layer 39 and lower electrode layer 37. Thus, a driving voltage from the driving circuit 46 is applied to each piezoelectric element 32 through each bump 40. Moreover, a dimension (height) of the bump 40 from the sealing plate 33 in a state before the pressure chamber forming substrate 29 on which the vibration plate 31 is laminated and the sealing plate 33 are bonded is greater than a distance between the vibration plate 31 and the sealing plate 33 after bonding, and is set to be, for example, 10 μm to 30 μm. That is, the bump 40 is set be slightly collapsed after bonding between the pressure chamber forming substrate 29 and the sealing plate 33. Furthermore, a surface (lower surface) other than the bump 40 in the surface (lower surface) of the sealing plate 33 is covered by an oxide film having an insulating property such as a silicon oxide film ($SiO_2$) (not illustrated).

The adhesive 43 bonding the sealing plate 33 and the pressure chamber forming substrate 29 on which the vibration plate 31 is laminated is disposed in a region (the second region a2) outside of a region corresponding to the pressure chamber 30 in a surface on a side of the pressure chamber forming substrate 29 on which the piezoelectric element 32 is formed and a region that does not interfere with the bump 40, that is, a region outside of the bump 40. In the embodiment, the adhesive 43 is disposed so as to surround a periphery of the piezoelectric element 32 in a strip shape across a part of the upper electrode layer 39 and the lower electrode layer 37. Specifically, as illustrated in FIG. 3, the adhesive 43 is disposed in the strip shape along a column of the piezoelectric elements 32 further on the inside (piezoelectric element 32 side) than the bump 40 disposed on one side (left side in FIG. 3) of the pressure chamber 30 in the longitudinal direction. Furthermore, the adhesive 43 is disposed along the column of the piezoelectric elements 32 on the inside and the outside of the bump 40 disposed on the other side (right side in FIG. 3) of the pressure chamber 30 in the longitudinal direction. Furthermore, in the embodiment, the adhesive 43 adheres on the vibration plate 31, but the vibration plate 31 of a region to which the adhesive 43 is bonded may be removed. Moreover, in the embodiment, some adhesive 43 is disposed on the electrode layer, but the adhesive 43 may be disposed so as to avoid the electrode layer. Furthermore, in the embodiment, the bump 40 is provided outside of a sealing space, but the adhesive 43 is disposed without crossing a part of the upper electrode layer 39 and the lower electrode layer 37 if the bump 40 is provided in the sealing space.

Here, as illustrated in FIG. 4, the adhesive 43 is formed such that a width Wa (dimension in a direction parallel to the adhesion surface and in a direction orthogonal to an extending direction of the adhesive 43) in a center portion in a height direction (thickness direction or a direction perpendicular to the adhesion surface) with respect to a surface of the vibration plate 31 or the sealing plate 33 is greater than a width Wb in end portions in the same direction. In other words, an intermediate portion of the adhesive 43 in a state of being cured between the vibration plate 31 and the sealing plate 33 is formed to protrude to the outside. In the embodiment, a width in the adhesion surface on the vibration plate 31 side and a width in the adhesion surface on the sealing plate 33 side are aligned to be substantially equal to each other, and are formed such that the width is gradually widened from both adhesion surfaces to a substantially intermediate position of the adhesion surfaces. That is, the center portion of the adhesive 43 in the height direction is formed such that a cross section area (area in a surface parallel to the adhesion surface) thereof spreads compared to the end portions. Moreover, in the above, the description is given by focusing on the adhesive 43 illustrated in FIG. 4, that is, the adhesive 43 disposed on one side (left side in FIG. 3). However, another adhesive 43 bonding the sealing plate 33 and the pressure chamber forming substrate 29 on which the vibration plate 31 is laminated is also formed in the same shape. Furthermore, a method of forming the adhesive 43 having such a shape will be described below. Furthermore, as the adhesive 43, resin including photosensitivity and thermosetting is preferably used. For example, resin containing epoxy resin, acrylic resin, phenolic resin, polyimide resin, silicone resin, styrene resin, and the like as a main component is preferable.

In the recording head 3 formed as described above, the ink from the ink cartridge 7 is introduced into the pressure chamber 30 through the ink introduction path, the reservoir 18, the common liquid chamber 25, and the individual communication path 26, and the driving signal from the driving circuit 46 is supplied to the piezoelectric element 32 through the bump 40. Thus, the pressure variation is generated in the pressure chamber 30 by driving the piezoelectric element 32. Therefore, ink droplets are ejected from the nozzle 22 through the nozzle communication path 27 of the communication substrate 24 by using the pressure variation.

Next, a manufacturing method of the recording head 3, particularly, the actuator unit 14 described above will be described. FIGS. 5A and 5B are schematic views describing bonding of both substrates by the adhesive 43, FIG. 5A is a sectional view describing a shape of the adhesive 43 before bonding both substrates, and FIG. 5B is a sectional view describing the shape of the adhesive 43 after bonding both substrates. Furthermore, FIG. 6 is a flowchart describing a flow of manufacturing steps of the actuator unit 14. Moreover, in the embodiment, a step of forming the bump 40 on the sealing plate 33 side and a step of forming the adhesive 43 on the pressure chamber forming substrate 29 side are performed in parallel, but any one of the steps may be performed earlier.

Initially, a manufacturing step on the sealing plate 33 side will be described. First, the driving circuit 46 and the like are produced on the silicon single crystal substrate by the semiconductor process and the sealing plate 33 is formed (Sa1). Next, in a bump electrode forming step, the bump 40 having a predetermined height (dimension from the outermost surface of the sealing plate 33) is formed on a surface side of the sealing plate 33 in which the driving circuit 46 is formed. Specifically, first, a resin film is coated on the surface of the sealing plate 33 and then the inner resin 41 is formed by performing a patterning process such as etching (Sa2). Next, a metal film is deposited by vapor deposition, sputtering, and the like, the conductive film 42 is formed by performing a patterning process (Sa3). Moreover, the surface of the conductive film 42 of a base which is configured of Cu, Ni, Al, and the like may be further covered by Au plating and the like. Thus, the bump 40 protruding on the same side as the surface of the sealing plate 33 on the pressure chamber forming substrate 29 side is formed. In this case, the bump 40 is formed to be higher than the height (that is the distance between the vibration plate 31 and the sealing plate 33) from the surface of the vibration plate 31 to the surface of the sealing plate 33 after bonding. For example, the distance between the vibration plate 31 and the sealing plate 33 after bonding is set to be 5 μm to 25 μm and the height of the bump 40 formed on the sealing plate 33 is set to be 10 μm to 30 μm.

Next, a manufacturing step on the pressure chamber forming substrate 29 side will be described. First, the pressure chamber 30 is formed in the silicon single crystal substrate by photolithography, an etching technique, and the like. Furthermore, the vibration plate 31, the piezoelectric element 32, and the like are formed on the silicon substrate. Thus, the pressure chamber forming substrate 29 on which the vibration plate 31 and each layer are laminated is formed (Sb1). Moreover, if the pressure chamber forming substrate 29 on which the vibration plate 31 and the piezoelectric element 32 are laminated is formed, any method may be used, for example, the vibration plate and the piezoelectric element are laminated on the silicon single crystal substrate and then the pressure chamber may be formed. Next, in an adhesive laminating step, the adhesive 43 having a height Ha from the surface of the pressure chamber forming substrate 29 that is equal to or less than a height Hb of the bump 40 is laminated on the pressure chamber forming substrate 29 on which the vibration plate 31 and each layer are laminated. For example, the adhesive 43 is laminated such that the height Ha from the surface of the pressure chamber forming substrate 29 is 10 μm to 30 μm. Specifically, in an applying step, the liquid adhesive 43 having photosensitivity and a thermosetting property is coated on the vibration plate 31 by using a spin coater (Sb2) and the like, and an adhesive layer having elasticity is formed by baking (heating) (Sb3). Then, in an exposing step, the adhesive layer is irradiated with light (Sb4) and then in a developing step, the adhesive layer is developed. Thus, a shape of the adhesive 43 is patterned in a predetermined position (Sb5).

Then, if the bump 40 is formed in the sealing plate 33 and the adhesive 43 is formed in the pressure chamber forming substrate 29 by the steps described above, the adhesive 43 abuts the sealing plate 33 and the pressure chamber forming substrate 29 and the sealing plate 33 are bonded in a substrate bonding step. Specifically, as illustrated in FIG. 5A, the pressure chamber forming substrate 29 is relatively moved to and laminated on the sealing plate 33 side to interpose the adhesive 43 therebetween (Sc1). In this state, as indicated by arrows in FIG. 5B, the bump 40 and the adhesive 43 are contracted in the height direction by pressing on the pressure chamber forming substrate 29 side and the sealing plate 33 side, and heating is performed in this state (Sc2). For example, pressure is applied to the extent that the bump 40 and the adhesive 43 are collapsed by 3 μm to 5 μm and the adhesive 43 is cured by applying heat of 120° C. to 300° C. for 5 minutes to 4 hours. Thus, the center portion of the adhesive 43 in the height direction spreads to the outside and both end portions of the adhesive 43 in the height direction are adhered to the pressure chamber forming substrate 29 and the sealing plate 33.

Here, the height of the bump 40 is formed to be higher than the height from the surface of the vibration plate 31 to the surface of the sealing plate 33 after bonding and since both substrates are bonded in a state where the bump 40 is collapsed, it is possible to reliably conduct the electrode layers 37 and 39 corresponding to the bump 40. Furthermore, since the adhesive 43 is formed such that the height Ha is equal to or less than the height Hb of the bump 40 and the adhesive 43 is cured in a state of being collapsed, it is possible to check conduction between the electrode layers 37 and 39 corresponding to the bump 40 by confirming a spreading degree (that is, a collapse degree of the adhesive 43) of the center portion of the adhesive 43 in the height direction.

The actuator unit 14 that is manufactured by the steps described above is positioned and fixed to the flow path unit 15 (communication substrate 24) by using the adhesive and the like. Then, the recording head 3 is manufactured by bonding the head case 16 and the flow path unit 15 in a state where the actuator unit 14 is accommodated in the accommodation space 17 of the head case 16.

As described above, both substrates are bonded by curing the adhesive 43 by heating in a state where the adhesive 43 is contracted in the height direction by pressing. Thus, it is possible to suppress that the adhesive 43 spreads in the adhesion surface between the pressure chamber forming substrate 29 on which the vibration plate 31 and each layer are laminated and the sealing plate 33 in the surface direction while ensuring a sufficient amount of the adhesive 43 to ensure the adhesive strength. Thus, it is possible to suppress that the adhesive 43 protrudes from a predetermined region and to allow the adhesive 43 to approach other portions configuring the actuator unit 14, for example, with respect to the displacement section (first region a1) of the vibration plate 31 as much as possible. As a result, it is possible to reduce the size of the actuator unit 14 and the recording head 3 while suppressing generation of foreign matter due to peeling of the adhesive by ensuring sufficient adhesive strength.

In the embodiment described above, the adhesive 43 is formed on the pressure chamber forming substrate 29 side in a state before the sealing plate 33 and the pressure chamber forming substrate 29 are bonded, however, the invention is not limited to the embodiment. For example, the adhesive may be configured to be formed on the sealing plate side. In this case, in the adhesive laminating step, the adhesive is formed on the sealing plate side.

Then, as described above, as the liquid ejecting head, the ink jet type recording head mounted on the ink jet printer is exemplified, but it is possible to apply to a liquid ejecting head to eject a liquid other than the ink. For example, the invention can be applied to a color material ejecting head used for manufacturing a color filter such as a liquid crystal display, an electrode material ejecting head used for forming an electrode such as an organic electro luminescence (EL) display and a field emission display (FED), a bio-organic material ejecting head used for manufacturing a bio-chip (biochemical element), and the like.

Furthermore, the invention is not limited to those used as the actuator for the liquid ejecting head and, for example, can be applied to a piezoelectric device for use in various sensors and the like.

REFERENCE SIGNS LIST

1 printer
3 recording head
14 actuator unit
15 flow path unit
16 head case
17 accommodation space
18 reservoir
21 nozzle plate
22 nozzle
24 communication substrate
25 common liquid chamber
26 individual communication path
28 compliance sheet
29 pressure chamber forming substrate
30 pressure chamber
31 vibration plate
32 piezoelectric element
33 sealing plate
37 lower electrode layer
38 piezoelectric layer
39 upper electrode layer
40 bump
41 inner resin
42 conductive film
43 adhesive
46 driving circuit

The invention claimed is:

1. A manufacturing method of a piezoelectric device including a first substrate in which a piezoelectric element and an electrode layer electrically connected to the piezoelectric element is formed, a second substrate which is disposed so as to face the piezoelectric element with a predetermined space and in which a bump electrode abutting and conducting the electrode layer is formed, and thermosetting adhesive that bonds the first substrate and the second substrate in a state where a distance between the first substrate and the second substrate is maintained, the manufacturing method comprising:

forming the bump electrode having a predetermined height in the second substrate;

forming the adhesive that includes photosensitivity and is disposed so as to surround a periphery of the piezoelectric element and to be located between the piezoelectric element and the bump electrode and of which a height from a surface of the substrate is equal to or less than a height of the bump electrode on one of the first substrate and the second substrate; and bonding the first substrate and the second substrate by curing the adhesive by heating in a state where the adhesive is contracted in a height direction by pressing while interposing the adhesive between the first substrate and the second substrate, wherein the adhesive has a width in a center portion in a height direction with respect to a surface of the first substrate or the second substrate greater than a width in end portions in the same direction.

2. A manufacturing method of a liquid ejecting head comprising:

manufacturing the piezoelectric device by the manufacturing method according to claim 1.

3. A piezoelectric device comprising:

a first substrate that includes a piezoelectric element provided in a first region where bending deformation is allowed and an electrode layer electrically connected to the piezoelectric element;

a second substrate in which a bump electrode abutting and conducting the electrode layer is formed, and which is disposed so as to face the piezoelectric element with a predetermined space; and an adhesive that includes photosensitivity and is disposed so as to surround a periphery of the piezoelectric element and to be located between the piezoelectric element and the bump electrode, wherein the adhesive bonds the first substrate and the second substrate in a state where a distance between the first substrate and the second substrate is maintained, wherein the adhesive has a width in a center portion in a height direction with respect to a surface of the first substrate or the second substrate greater than a width in end portions in the same direction.

4. A liquid ejecting head comprising:
the piezoelectric device according to claim 3.

* * * * *